(12) United States Patent
Zhang

(10) Patent No.: US 10,211,117 B2
(45) Date of Patent: Feb. 19, 2019

(54) CRIMPING POWER MODULE

(71) Applicant: SHENZHEN ESPIRIT TECHNOLOGY CO., LTD., Guangdong (CN)

(72) Inventor: Jiefu Zhang, Guangdong (CN)

(*) Notice: Subject to any disclaimer, the term of this patent is extended or adjusted under 35 U.S.C. 154(b) by 399 days.

(21) Appl. No.: 14/909,995

(22) PCT Filed: Aug. 6, 2013

(86) PCT No.: PCT/CN2013/080935
§ 371 (c)(1),
(2) Date: Feb. 4, 2016

(87) PCT Pub. No.: WO2015/017988
PCT Pub. Date: Feb. 12, 2015

(65) Prior Publication Data
US 2016/0181170 A1    Jun. 23, 2016

(51) Int. Cl.
*H01L 23/16*    (2006.01)
*H01L 23/40*    (2006.01)
(Continued)

(52) U.S. Cl.
CPC .............. *H01L 23/16* (2013.01); *G06F 1/20* (2013.01); *G06F 1/203* (2013.01); *G06F 1/206* (2013.01);
(Continued)

(58) Field of Classification Search
CPC ....... H01L 23/053; H01L 23/16; H01L 23/40; H01L 23/4006; H01L 2023/4087; H01L 2023/4062; H01L 2924/0002; H05K 7/20; H05K 7/20009; H05K 7/20136; H05K 7/20145; H05K 7/20172; H05K 7/20545; H05K 7/20554; G06F 2200/201; G06F 1/20; G06F 1/203; G06F 1/206
See application file for complete search history.

(56) References Cited

U.S. PATENT DOCUMENTS

2001/0040037 A1* 11/2001 Negishi ............... H05K 5/061
                                                    174/17 CT
2004/0223304 A1* 11/2004 Kobayashi ......... B60R 16/0238
                                                    361/715
(Continued)

*Primary Examiner* — Mukundbhai G Patel
*Assistant Examiner* — Zhengfu J Feng
(74) *Attorney, Agent, or Firm* — Prakash Nama; Global IP Services, PLLC

(57) ABSTRACT

A crimping power module includes a shell (10), a cover (12), and an electric insulation substrate (13) crimped to a heat dissipation device. The cover and the substrate are respectively mounted to a first surface (111) and a second surface (112) of the shell. The second surface defines an annular slot (113) in a position facing sides of the substrate. The slot is embedded with a first elastic member (15) elastically abutted against the substrate. The elastic member is higher than the second surface, allowing the shell to adjust a pressure flexibly applied on the heat dissipation device by the substrate. An elastic buffer is provided through defining the slot embedded with the elastic member, to prevent the substrate from fracturing, and adjust the pressure to ensure tight crimping between the substrate and the heat dissipation device, which decreases thermal resistance, and increases heat dissipation efficiency.

7 Claims, 2 Drawing Sheets

(51) Int. Cl.
*H05K 7/20* (2006.01)
*G06F 1/20* (2006.01)
*H01L 23/053* (2006.01)

(52) U.S. Cl.
CPC ............ *H01L 23/053* (2013.01); *H01L 23/40* (2013.01); *H01L 23/4006* (2013.01); *H05K 7/20* (2013.01); *H05K 7/20009* (2013.01); *H05K 7/20136* (2013.01); *H05K 7/20145* (2013.01); *H05K 7/20172* (2013.01); *H05K 7/20545* (2013.01); *H05K 7/20554* (2013.01); *G06F 2200/201* (2013.01); *H01L 2023/4062* (2013.01); *H01L 2023/4087* (2013.01); *H01L 2924/0002* (2013.01)

(56) References Cited

U.S. PATENT DOCUMENTS

2011/0228498 A1* 9/2011 Kawai ................ H05K 7/20854
  361/752
2014/0065758 A1* 3/2014 Huang .................. H01L 31/048
  438/73

* cited by examiner

CRIMPING POWER MODULE

BACKGROUND OF THE INVENTION

The present invention generally relates to power electronics technology, and more specifically, relates to a crimping power module.

Currently, a crimping power module generally adopts a hard crimp connection between a shell of the crimping power module and an electric insulation substrate. Because the electric insulation substrate is vulnerable, in design, a surface area of the electric insulation substrate cannot be designed too large, otherwise, there is a danger that the electric insulation substrate is broken during crimping, causing the level of the power rate of the crimping power module with hard crimp connection to be not designed too great and to be only applied on power modules of low power. When chips are welded on existing electric insulation substrates, the electric insulation substrates generate a slight anti-arc because of coefficients of heat expansion of the chips and the electric insulation substrates being not the same, in use, a thermal grease layer of the crimping power module is increased, which increases thermal resistance and decreases thermal efficiency.

BRIEF SUMMARY OF THE INVENTION

Therefore, a crimping power module is provided, which has high-power, and fast thermal conductivity.

A crimping power module comprises a shell, a cover, and an electric insulation substrate for being crimped to a heat dissipation device. The shell comprises a first surface facing the cover and a second surface facing the electric insulation substrate. The cover is mounted to the first surface. The electric insulation substrate is mounted to the second surface. The second surface of the shell defines an annular slot in a position of the second surface facing sides of the electric insulation substrate. The annular slot is embedded with a first elastic member for being elastically abutted against the electric insulation substrate. The first elastic member extends out of the second surface of the shell, to allow the shell to adjust a pressure flexibly crimped to the heat dissipation device by the electric insulation substrate.

In the crimping power module, the second surface of the shell defines the annular slot embedded with the first elastic member, in assembly, the shell is flexibly crimped to the electric insulation substrate through the elastic member, that is to say, the elastic member provides a certain elastic stress buffer between the shell and the electric insulation substrate, to prevent the electric insulation substrate from fracturing, thereby, successfully resolving the defect of the electric insulation substrate being relatively fragile and unable to manufacture great power modules. Furthermore, the pressure flexibly applied on the heat dissipation device by the electric insulation substrate can be adjusted through controlling the compression height or degree of the elastic member. Therefore, the electric insulation substrate can be firmly crimped to the heat dissipation device, and a thickness of a thermal grease layer between the electric insulation substrate and the heat dissipation device can be decreased (in response to the thermal grease being adopted), thus, decreasing thermal resistance of the crimping power module, and increasing the thermal efficiency of the crimping power module.

DETAILED DESCRIPTION OF THE INVENTION

Figure 1:
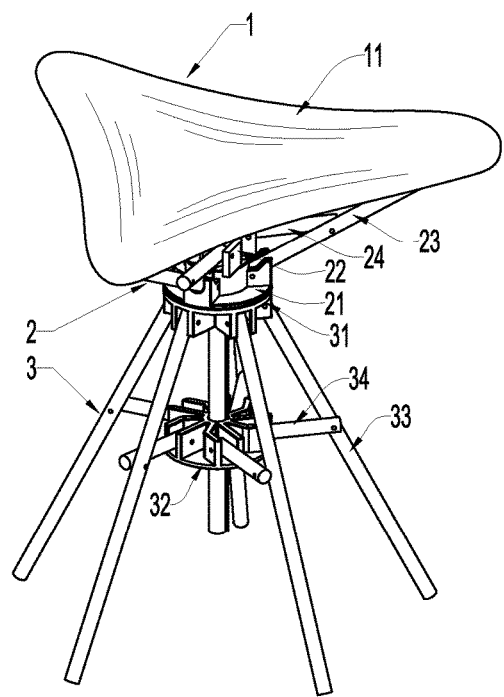
FIG. 1 is a top plan view of a crimping power module of an embodiment of the present invention.
Figure 2:
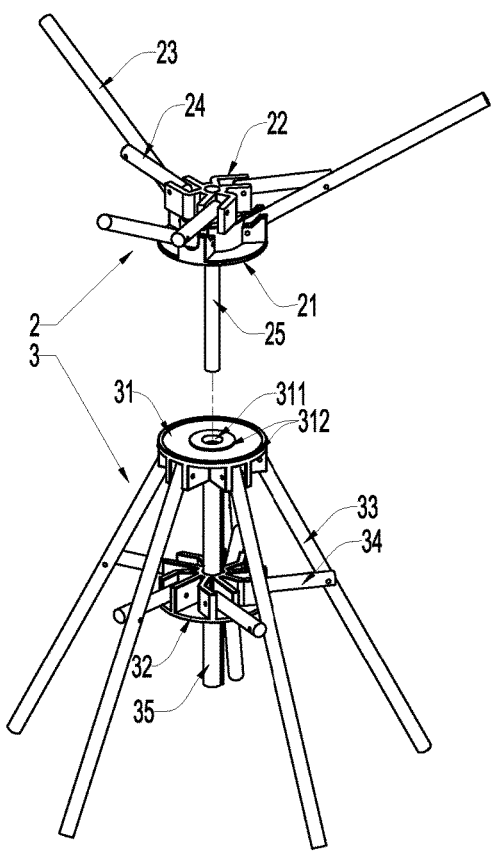
FIG. 2 is a cross-sectional view of the crimping power module of FIG. 1, taken along the first elastic member.
Figure 3:
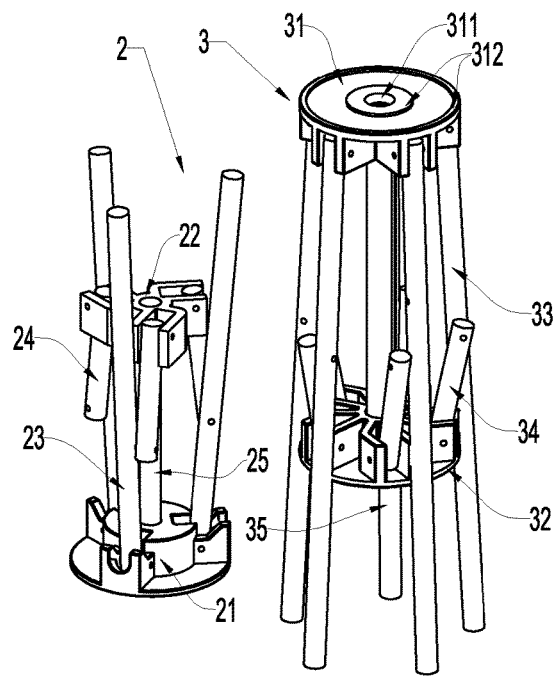
FIG. 3 is a cross-sectional view of the crimping power module of FIG. 1, taken along axes of two fasteners.

To make the objective, technical solution and advantages of the present invention be more clear and apparent, the present invention will be described in further detail with the combination of the accompanying drawings and the following embodiments. If should be understood that the specific embodiments described herein are merely examples for explaining the present invention and are not intended to limit the present invention.

Referring to FIGS. 1 to 4, an embodiment of the present invention provides a crimping power module 10 including a shell 11, a cover 12, and an electric insulation substrate 13 for being crimped to a heat dissipation device. The shell 11 includes a first surface 111 facing the cover 12, and a second surface 112 facing the electric insulation substrate 13. The cover 12 is mounted to the first surface 111, and the electric insulation substrate 13 is mounted to the second surface 112. The second surface 112 of the shell 11 defines an annular slot 113 in a position of the shell 11 facing sides of the electric insulation substrate 13. The annular slot 113 is embedded with a first elastic member 15 for being elastically abutted against the electric insulation substrate 13. The first elastic member 15 extends out of the second surface 112, allowing the shell 11 to adjust a pressure of the electric insulation substrate 13 crimped to the heat dissipation device (not shown).

Figure 4:
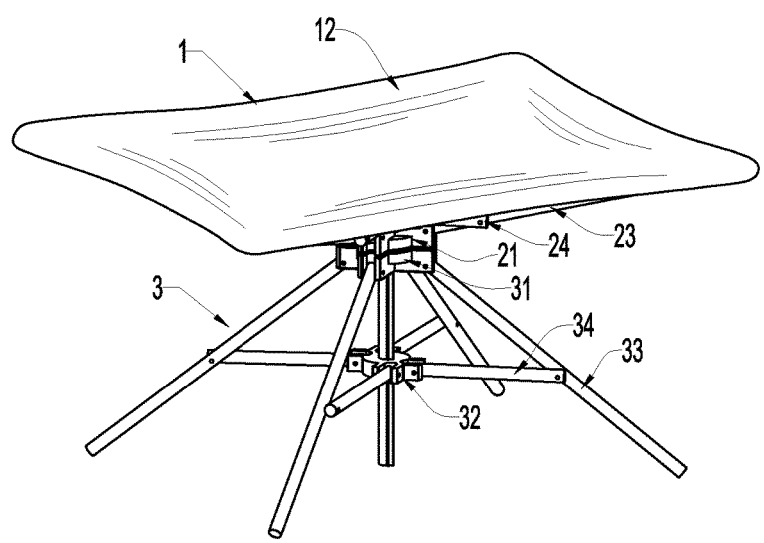
FIG. 4 is an exploded, isometric view of the crimping power module of FIG. 1.

Referring to FIG. 4, sides of the first surface 111 of the shell 11 are protruded, to form a block wall 118. A plurality of power components 132, such as but not limited to include MOS semiconductors, is mounted on the electric insulation substrate 13. The shell 11 is frame structure, that is to say, a portion of the shell 11 facing the power components 132 is hollowed out, and the shell 11 is abutted against sides of the electric insulation substrate 13 without mounting the power components 132.

The first surface 111 defines an accommodation groove 114 embedded with a second elastic member 16 flexibly or elastically supported between the cover 12 and the shell 11. Preferably, the second elastic member 16 provides a buffer for the cover 12 being firmly fixed to the shell 11, which allows the cover 12 to be flexibly or elastically mounted to the first surface of the shell 11. In a preferred embodiment of the invention, the accommodation groove 114 is defined in an inner surface of the block wall 118, and a portion of the block wall 118 defining the accommodation groove 114 is slightly protruded out, to arrange the accommodation groove 114. Specifically, the block wall 118 forms a stepped portion 119. A height of the stepped portion 119 corresponding to a base of the shell 11 is changed according to a distance between the cover 12 and the electric insulation substrate 13. A top of the second elastic member 16 is coplanar with or slightly higher than the stepped portion 119. Referring to FIGS. 1-4, the groove 114 is a columnar groove for accommodating the second elastic member 16. In the figured embodiment, two accommodation grooves 114 symmetrically defined in two sides of the shell 11 are preferably adopted. Sides of the cover 12 and the shell 11 define through holes 125 and 115. A fastener 17 extends through the through hole 125 the corresponding through hole 115, to crimp the cover 12, the second elastic member 16, the shell 11, the first elastic member 15, and the electric insulation substrate 13 to the heat dissipation device. The through holes 125 and 115 are defined according to positions of the accommodation grooves 114. For instance, the through holes 115 extend through bottoms of the accommodation grooves 114, and the through holes 125 are defined in two tabs 124 extending from the portions of opposite sides the cover 12 aligning with the accommodation grooves 114. The second elastic members 16 define through holes 161. Therefore, the fasteners 17 extend through the through holes 125 of the cover 12; the through holes 161 of the second elastic members 16, and the through holes 115 of the shell 11. The second elastic members 16 provide adequate buffer when the fasteners 17 are tightened.

In another embodiment, the accommodation groove 114 is annular, and defined in a surface of the stepped portion 119. The second elastic member 16 is annular, and similar to the first elastic member 15. The through holes 125 and 115 are defined to avoid the accommodation groove 114 and the second elastic member 16, therefore, the fastener 17 also avoids the accommodation groove 114 and the second elastic member 16. The annular design of the second elastic member 16 provides buffer between sides of the cover 12 and the shell 11.

In another embodiment, the accommodation grooves 114 are deep enough to communicate with the annular slot 113. The first elastic member 15 and the second elastic members 16 are integrally formed. For instance, the second elastic members 16 can be protrusions symmetrically extending from two sides of the first elastic member 15, and the protrusions define through holes for the fasteners 17 extending through.

The cover 12 forms at least one crimp pole 121 abutted against the electric insulation substrate 13. Preferredly, the crimp pole 121 is integrally formed with the cover 12. For instance, the crimp pole 121 is integrally extended from a center 122 of the cover 12, and the center 122 of the cover 12 is depressed down toward the electric insulation substrate 13. More advantageously, the crimp pole 121 elastically contacts the electric insulation substrate 13, and a pressure applied to the electric insulation substrate 13 by the crimp pole 121 is adjusted. For instance, a bottom end of the crimp pole 121 is flexible, or a flexible member is mounted to the bottom end of the crimp pole 121, to elastically contact the electric insulation substrate 13.

A size of the crimp pole 121 is defined to allow the crimp pole 121 to firmly abut against the electric insulation substrate 13 in response to the fasteners 17 being tightened to make the electric insulation substrate 13 firmly abut against the heat dissipation device, and to allow a clearance to be formed between the crimp pole 121 and the electric insulation substrate 13 in response to the fasteners 17 being loosened. The clearance is less than a sum of a deformation quantity of the first elastic member 15 and a deformation quantity of the second elastic member 16 minus a deformation quantity of the electric insulation substrate 13.

In the figured embodiment, there is one crimp pole 121 located at a center of the cover 12. To better avoid the power components 132 on the electric insulation substrate 13, areas of the electric insulation substrate 13 without arranging the power components 132 are several spaced empty areas. Because the power components 132 are generally symmetrically arranged, the empty areas are symmetrically arranged, in another embodiment, there is a plurality of crimp poles 121 preferredly including a crimp pole 121 at a center or not at a center. Furthermore, the crimp poles 121 except the crimp pole 121 at the center can be symmetrically arranged or radially (or centrosymmetrically) arranged on the bottom of the cover 12 about the crimp pole 121 at the center. Heights of the crimp poles 121 are the same, therefore, the crimp poles 121 equably apply forces on the electric insulation substrate 13, to allow a bottom of the electric insulation substrate 13 to be firmly abutted against the heat dissipation device. The first elastic member 15 is elastically or flexibly abutted against the sides of the electric insulation substrate 13, to bias the electric insulation substrate 13 to be firmly abutted against the heat dissipation device. The crimp poles 121 are further abutted against a center of the electric insulation substrate 13 or abutted against centers of the electric insulation substrate 13 excluding the sides of the electric insulation substrate 13, thereby further assuring the electric insulation substrate 13 to be firmly abutted against the heat dissipation device. Therefore, even though the electric insulation substrate 13 generates a slight anti-arc because of coefficients of heat expansion of the chips and the electric insulation substrate 13 being not the same, the first elastic member 15 and the crimp poles 121 can overcome the anti-arc, and can also adjust force applied on the beat dissipation device by the electric insulation substrate 13. In use, because of prolonged use or other reasons, the contact between the electric insulation substrate 13 and the heat dissipation device may be loose or thermal glue between the electric insulation substrate 13 and the heat dissipation device may be deformed, the first elastic member 15 can take effect to bias the electric insulation substrate 13 to firmly abut against the heat dissipation device.

Preferredly, the second surface 112 of the shell 11 defines an annular depressed portion 110 facing the sides of the electric insulation substrate 13. The depressed portion 110 is lower than the second surface 112. A sum of a thickness of the electric insulation substrate 13 and a length of the first elastic member 15 both extending out of the second surface 112 of the shell 11 is 30%-60% of an original length of the first elastic member 15. That is to say, a height of the electric insulation substrate 13 extending out of the second surface 112 of the shell 11 is 30%-60% of the original length of the first elastic member 15. Therefore, a compression range of elasticity of the first elastic member 15 is 30%-60% of the elastic length of the first elastic member 15. Preferredly, the compression range of elasticity of the second elastic member 16 is 30%-60% of an original length of the second elastic member 16. The pressure applied on the electric insulation substrate 13 is controlled by the deformation quantity of the first elastic member 15 and the deformation quantity of the second elastic members 16, and a size of the pressure is defined according to adjustment of deformation redundancy of the shell 11 deforming the first elastic member 15 and the second elastic members 16. The first elastic member 15 and the second elastic members 16 are preferredly made of elastic material, such as rubber.

In assembly, the first elastic member 15 is received in the slot 113, and the second elastic members 16 are received in the corresponding accommodation grooves 114. The shell 11, the cover 12, and the electric insulation substrate 13 are aligned to aligning the through holes 115, 125, and 161. The fasteners 17, such as bolts, are extended through the through holes 115, 161, and 125 to be engaged in nuts (not shown), in actual use, the heat dissipation device can define mounting holes to allow the fasteners 17 to engage in, thereby assembling the shell 11, the cover 12, the electric insulation substrate 13, and the heat dissipation device together. In another embodiment as shown in FIG. 4, the shell 11 defines screw holes 117 in the sides, and the shell 11 is fixed to the heat dissipation device by fasteners 116. The pressure of the fastener 17 intently applying on the cover 12 and the shell 11 can efficiently control the flexible pressure crimped to the electric insulation substrate 13 by the crimp pole 121 of the cover 12 through the second elastic members 16.

From the above, in the crimping power module 10, the shell 11 defines the annular slot 13 in the second surface 112 for receiving the first elastic member 15. In assembly, the shell 11 flexibly crimps the electric insulation substrate 13 through the first elastic member 15. That is to say, the first elastic member 15 provides a certain elastic stress buffer between the shell 11 and the electric insulation substrate 13, to prevent the electric insulation substrate 13 from fracturing, thereby, successfully resolving the defect of the electric insulation substrate 13 being relatively fragile and unable to manufacture great power modules. Furthermore, the pressure flexibly applied on the heat dissipation device by the electric insulation substrate 13 can be adjusted through controlling the compression height or degree of the first elastic member 15. The electric insulation substrate 13 can be firmly crimped to the heat dissipation device, and a thickness of a thermal grease layer (in response to being adopted) between the electric insulation substrate 13 and the heat dissipation device can be decreased, to decrease thermal resistance of the crimping power module 10, and increase the thermal efficiency of the crimping power module 10.

The above is only a preferred embodiment of the present invention, it is not intended to limit the present invention. Any modifications, equivalent replacement and improvement, etc. made within the spirit and principles of the present invention should be included in the protection scope of the present invention within.

What is claimed is:

1. A crimping power module, comprising: a shell comprising a first surface and a second surface; a cover mounted to the first surface; and an electric insulation substrate mounted to the second surface and to be crimped to a heat dissipation device; wherein, the second surface defines an annular slot in a position facing sides of the electric insulation substrate, the annular slot is embedded with a first elastic member elastically abutted against the electric insulation substrate, the first elastic member extends out of the second surface, to allow the shell to adjust a pressure flexibly crimped to the heat dissipation device by the electric insulation substrate, a plurality of power components is mounted on the electric insulation substrate; wherein the cover comprises at least one crimp pole abutted against and contacting the electric insulation substrate, the at least one crimp pole is integrally formed with the cover, an area of the cover forming the at least one crimp pole is depressed down toward the electric insulation substrate.

2. The crimping power module of claim 1, wherein the contact between the at least one crimp pole of the cover and the electric insulation substrate is elastic and adjustable in pressure.

3. The crimping power module of claim 2, wherein sides of the cover and the shell define a plurality of through holes each equipped with a fastener for mounting the cover the second elastic members, and the shell together, and pressing the first elastic member to crimp the electric insulation substrate to the heat dissipation device.

4. The crimping power module of claim 3, wherein a size of the at least one crimp pole of the cover is defined to allow the at least one crimp pole to firmly abut against the electric insulation substrate in response to the fasteners being tightened to make the electric insulation substrate firmly abut against the heat dissipation device, and to allow a clearance to be formed between the at least one crimp pole and the electric insulation substrate in response to the fasteners being loosened.

5. The crimping power module of claim 1, wherein the second surface of the shell defines an annular depressed portion in a position facing the sides of the electric insulation substrate, the annular slot of the shell is defined in the depressed portion, a sum of a thickness of the electric insulation substrate and a length of the first elastic member both extending out of the second surface of the shell is 30%-60% of an original length of the first elastic member.

6. A crimping power module, comprising: a shell comprising a first surface and a second surface; a cover mounted to the first surface; and an electric insulation substrate mounted to the second surface and to be crimped to a heat dissipation device; wherein the second surface defines an annular slot in a position facing sides of the electric insulation substrate, the annular slot is embedded with a first elastic member elastically abutted against the electric insulation substrate, the first elastic member extends out of the second surface, to allow the shell to adjust a pressure flexibly crimped to the heat dissipation device by the electric insulation substrate, a plurality of power components is mounted on the electric insulation substrate; wherein the first surface of the shell defines a plurality of accommodation grooves each embedded with a second elastic member elastically supported between the cover and the shell, sides of the first surface of the shell forms a block wall, the block wall forms a stepped portion, each of the plurality of accommodation grooves is annular and defined in the stepped portion, and the second elastic members are annular.

7. A crimping power module, comprising: a shell comprising a first surface and a second surface; a cover mounted to the first surface; and an electric insulation substrate mounted to the second surface and to be crimped to a heat dissipation device; wherein the second surface defines an annular slot in a position facing sides of the electric insulation substrate, the annular slot is embedded with a first elastic member elastically abutted against the electric insulation substrate, the first elastic member extends out of the second surface, to allow the shell to adjust a pressure flexibly crimped to the heat dissipation, device by the electric insulation substrate, a plurality of power components is mounted on the electric insulation substrate; wherein the first surface of the shell defines a plurality of accommodation grooves each embedded with a second elastic member elastically supported between the cover and the shell, the plurality of accommodation grooves extends to communicate with the annular slot, and the first elastic member and the second elastic members are integrally formed.

* * * * *